(12) United States Patent
Choi et al.

(10) Patent No.: US 12,347,747 B2
(45) Date of Patent: Jul. 1, 2025

(54) SEMICONDUCTOR DEVICES INCLUDING A THROUGH-HOLE ELECTRODE

(71) Applicant: SAMSUNG ELECTRONICS CO., LTD., Suwon-si (KR)

(72) Inventors: Jimin Choi, Suwon-si (KR); Jongmin Lee, Suwon-si (KR); Yeonjin Lee, Suwon-si (KR); Jeonil Lee, Suwon-si (KR); Juik Lee, Suwon-si (KR); Minjung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 481 days.

(21) Appl. No.: 17/751,740

(22) Filed: May 24, 2022

(65) Prior Publication Data
US 2023/0077803 A1    Mar. 16, 2023

(30) Foreign Application Priority Data
Sep. 14, 2021    (KR) .................. 10-2021-0122231

(51) Int. Cl.
*H01L 23/48*    (2006.01)
*H01L 23/00*    (2006.01)
*H01L 25/065*    (2023.01)

(52) U.S. Cl.
CPC ............ *H01L 23/481* (2013.01); *H01L 24/05* (2013.01); *H01L 25/0657* (2013.01); *H01L 2224/0557* (2013.01); *H01L 2225/06513* (2013.01); *H01L 2225/06541* (2013.01)

(58) Field of Classification Search
CPC ......... H01L 23/481; H01L 2225/06541; H01L 2224/05557; H01L 21/76898; H01L 24/05; H01L 25/0657; H01L 2224/0557
See application file for complete search history.

(56) References Cited

U.S. PATENT DOCUMENTS

| | | | |
|---|---|---|---|
| 8,772,072 B2 | 7/2014 | Pyo | |
| 8,816,477 B2* | 8/2014 | Son | H01L 21/76898 257/621 |
| 9,806,004 B2* | 10/2017 | Lee | H01L 23/5226 |
| 10,128,168 B2 | 11/2018 | Choi et al. | |
| 10,777,487 B2 | 9/2020 | Choi et al. | |
| 10,832,953 B2 | 11/2020 | Wietstruck et al. | |
| 2008/0173972 A1 | 7/2008 | Gibson | |
| 2012/0049349 A1* | 3/2012 | Lee | H01L 21/76898 257/737 |

(Continued)

FOREIGN PATENT DOCUMENTS

KR    10-2015-0057140 A    5/2015

*Primary Examiner* — Mamadou L Diallo
(74) *Attorney, Agent, or Firm* — MORGAN, LEWIS & BOCKIUS LLP

(57) ABSTRACT

A semiconductor device includes a substrate, an etch stop layer on the substrate, a through-hole electrode extending through the substrate and the etch stop layer in a vertical direction substantially perpendicular to an upper surface of the substrate, and a conductive pad. The etch stop layer includes a first surface adjacent to the substrate and a second surface opposite the first surface. The through-hole electrode includes a protrusion portion that protrudes from the second surface of the etch stop layer. The conductive pad covers the protrusion portion of the through-hole electrode. The protrusion portion of the through-hole electrode is not flat.

20 Claims, 12 Drawing Sheets

(56) References Cited

U.S. PATENT DOCUMENTS

| | | | | |
|---|---|---|---|---|
| 2015/0179545 A1* | 6/2015 | Jeong | .................... | H01L 23/481 |
| | | | | 257/621 |
| 2015/0270220 A1* | 9/2015 | Moon | ................. | H01L 21/0337 |
| | | | | 257/737 |
| 2016/0020197 A1* | 1/2016 | Kang | ..................... | H01L 24/80 |
| | | | | 438/107 |
| 2016/0086874 A1* | 3/2016 | Choi | ....................... | H01L 24/03 |
| | | | | 257/774 |
| 2016/0155686 A1* | 6/2016 | Lee | .................... | H01L 23/5226 |
| | | | | 257/737 |
| 2017/0053872 A1* | 2/2017 | Lee | ................... | H01L 21/76879 |
| 2017/0062308 A1* | 3/2017 | Choi | ................... | H01L 23/5329 |
| 2017/0365545 A1* | 12/2017 | Kobayashi | ........ | H01L 23/49827 |

* cited by examiner

SEMICONDUCTOR DEVICES INCLUDING A THROUGH-HOLE ELECTRODE

CROSS-REFERENCE TO RELATED APPLICATION

This application claims priority under 35 U.S.C. § 119 to Korean Patent Application No. 10-2021-0122231 filed on Sep. 14, 2021, in the Korean Intellectual Property Office, the disclosure of which is hereby incorporated by reference in its entirety.

BACKGROUND

1. Field

Example embodiments of the present disclosure relate to a semiconductor device. More particularly, example embodiments of the present disclosure relate to a semiconductor device including a through-hole electrode.

2. Description of Related Art

A high bandwidth memory (HBM) device may include semiconductor chips vertically stacked. The semiconductor chips may be electrically connected with each other by a through-hole electrode, e.g., a through silicon via (TSV). In order to enhance the performance of the HBM device, a plurality of through-hole electrodes may be formed, and the through-hole electrodes may have different widths from each other.

SUMMARY

According to example embodiments, there is a semiconductor device. The semiconductor device may include a substrate, an etch stop layer on the substrate, a through-hole electrode extending through the substrate and the etch stop layer in a vertical direction substantially perpendicular to an upper surface of the substrate, and a conductive pad. The etch stop layer may include a first surface adjacent to the substrate and a second surface opposite the first surface. The through-hole electrode may include a protrusion portion that protrudes from the second surface of the etch stop layer. The conductive pad may cover the protrusion portion of the through-hole electrode. The protrusion portion of the through-hole electrode may not be flat.

According to example embodiments, there is a semiconductor device. The semiconductor device may include a substrate, an etch stop layer on the substrate, a through-hole electrode extending through the substrate and the etch stop layer in a vertical direction substantially perpendicular to an upper surface of the substrate, and a conductive pad. The through-hole electrode may include a sidewall having a slope with respect to the upper surface of the substrate that is constant in a horizontal direction substantially parallel to the upper surface of the substrate, and an upper surface having a slope with respect to the upper surface of the substrate that varies in the horizontal direction. The conductive pad may cover the upper surface of the through-hole electrode.

According to example embodiments, there is a semiconductor device. The semiconductor device may include a substrate, an etch stop layer on the substrate, a first through-hole electrode structure extending through the substrate and the etch stop layer in a vertical direction substantially perpendicular to an upper surface of the substrate, a second through-hole electrode structure extending through the substrate and the etch stop layer in the vertical direction and having a width different from that of the first through-hole electrode structure, and first and second conductive pads. The etch stop layer may include a first surface adjacent to the substrate and a second surface opposite the first surface. The first through-hole electrode structure may include a first through-hole electrode including a first protrusion portion that protrudes from the second surface of the etch stop layer, and a first insulation pattern covering a sidewall of the first through-hole electrode. The second through-hole electrode structure may include a second through-hole electrode including a second protrusion portion that protrudes from the second surface of the etch stop layer, and a second insulation pattern covering a sidewall of the second through-hole electrode. The first and second conductive pads may cover the first and second protrusion portions, respectively, of the first and second through-hole electrode structures. Each of the first and second protrusion portions of the first and second through-hole electrodes, respectively, may not be flat.

In the semiconductor device in accordance with example embodiments, the through-hole electrodes may have substantially the same height, and the conductive pads covering the through-hole electrodes may also have substantially the same height. That is, the through-hole electrodes may have uniform height and the conductive pads may have uniform height, and thus the semiconductor device may be easily manufactured.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, it will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section.

A direction substantially parallel to a surface of a reference substrate or a first substrate and/or a second substrate may be referred to as a horizontal direction, and a direction substantially perpendicular to the surface of the reference substrate or the first substrate and/or the second substrate may be referred to as a vertical direction. In the specifications, "up vs. down," "on and over vs. beneath and under," "upper surface vs. lower surface," and "upper portion vs.

lower portion" may not be absolute concepts, but may be relative concepts in order to describe opposite sides in the vertical direction. Thus, the above wordings may have the opposite meanings in different parts of this specifications.

FIGS. 1 to 9 are cross-sectional views illustrating stages in a method of manufacturing a semiconductor device in accordance with example embodiments.

Figure 1:
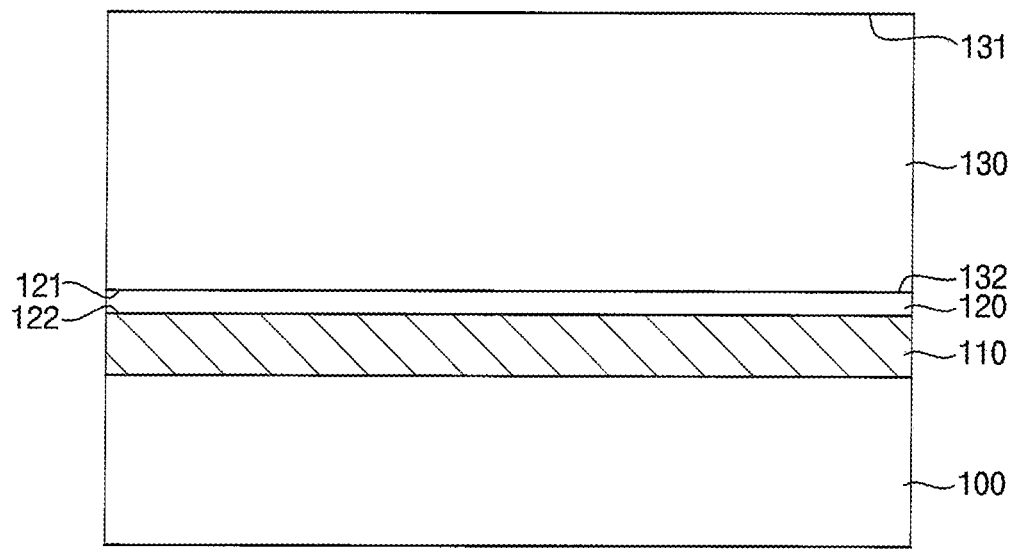
FIGS. 1 to 9 are cross-sectional views illustrating stages in a method of manufacturing a semiconductor device in accordance with example embodiments.

Referring to FIG. 1, a conductive pad layer 110, an etch stop layer 120, and a substrate 130 may be sequentially stacked on a sacrificial substrate 100.

For example, the sacrificial substrate 100 may include silicon, germanium, silicon-germanium, or a III-V group compound semiconductor, e.g., GaP, GaAs, or GaSb. In another example, the sacrificial substrate 100 may be a silicon-on-insulator (SOI) substrate or a germanium-on-insulator (GOI) substrate.

The conductive pad layer 110 may be formed on the sacrificial substrate 100. The conductive pad layer 110 may include a metal, e.g., tungsten, copper, aluminum, etc.

The etch stop layer 120 may be formed on the conductive pad layer 110, and may have first and second surfaces 121 and 122 opposite to each other. For example, the etch stop layer 120 may include an oxide, e.g., silicon oxide, a nitride, e.g., silicon nitride, and/or a carbonitride, e.g., silicon carbonitride.

The substrate 130 may be formed on the first surface 121 of the etch stop layer 120, and may have an active surface 131 and an inactive surface 132 opposite to each other. For example, the substrate 130 may include silicon, germanium, silicon-germanium, or a III-V group compound semiconductor, e.g., GaP, GaAs, or GaSb. In another example, the substrate 130 may be a SOI substrate or a GOI substrate.

Figure 2:
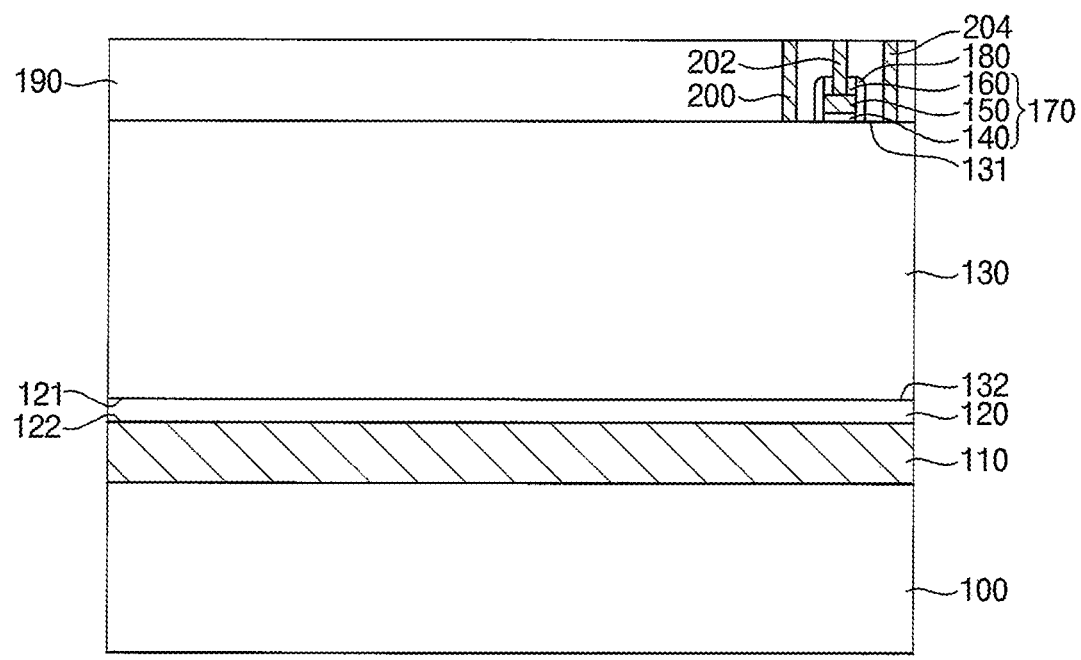

Referring to FIG. 2, a circuit pattern may be formed on the active surface 131 of the substrate 130, and a first insulating interlayer 190 may be formed on the active surface 131 of the substrate 130 to cover the circuit pattern. The circuit pattern may include, e.g., a transistor and first to third contact plugs 200, 202 and 204.

The transistor may include a gate structure 170 on the active surface 131 of the substrate 130 and impurity regions serving as source/drain regions, respectively, at upper portions of the substrate 130 adjacent to the gate structure 170. The gate structure 170 may include a gate insulation layer 140, a gate electrode 150, and a gate mask 160 sequentially stacked in the vertical direction. A gate spacer 180 may be further formed on a sidewall of the gate structure 170. The gate insulation layer 140 may include an oxide, e.g., silicon oxide, the gate electrode 150 may include a metal nitride, e.g., tungsten nitride, titanium nitride, tantalum nitride, etc., and the gate mask 160 and the gate spacer 180 may include a nitride, e.g., silicon nitride.

The first insulating interlayer 190 may be formed on the active surface 131 of the substrate 130 to cover the transistor. The first and third contact plugs 200 and 204 may extend through the first insulating interlayer 190 to contact the impurity regions and the second contact plug 202 may extend through the first insulating interlayer 190 to contact the gate electrode 150.

The first insulating interlayer 190 may include an oxide, e.g., silicon oxide, and the first to third contact plugs 200, 202 and 204 may include a metal, e.g., tungsten. Elements of the circuit pattern may be formed by a patterning process or a damascene process.

Figure 3:
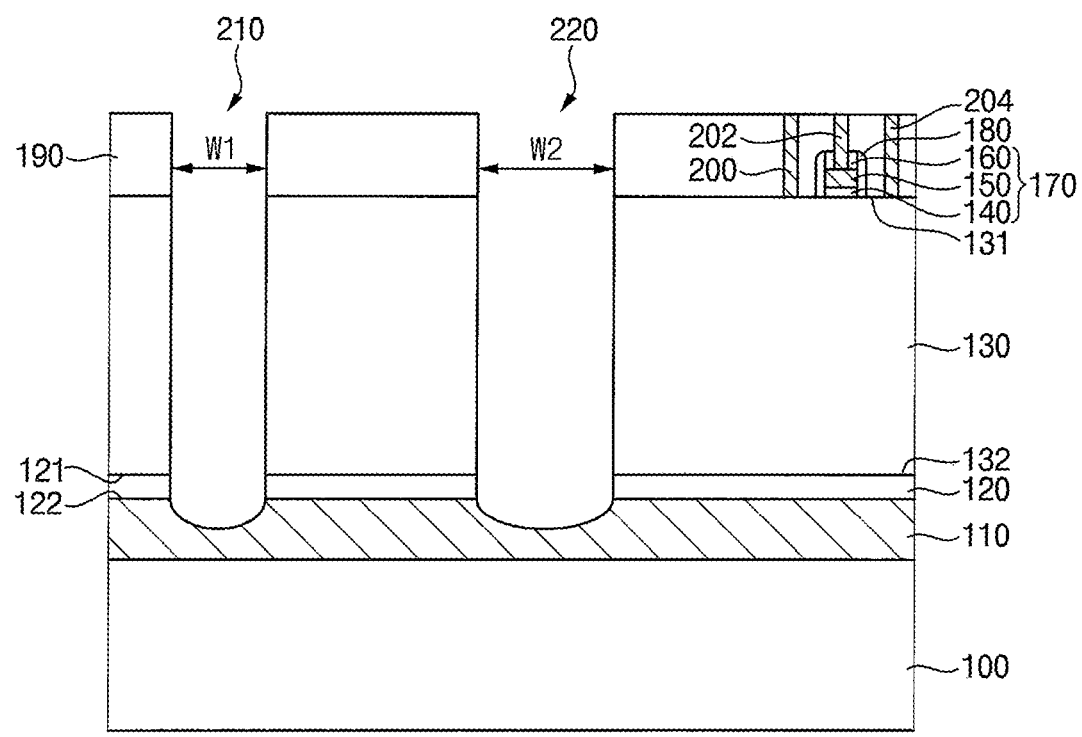

Referring to FIG. 3, first and second via holes 210 and 220 may be formed through the first insulating interlayer 190, the substrate 130, the etch stop layer 120, and a portion of the conductive pad layer 110 in the vertical direction by a first dry etching process. The first and second via holes 210 and 220 may have different widths from each other. In example embodiments, the first via hole 210 may have a first width W1, and the second via hole 220 may have a second width W2 greater than the first width W1.

In example embodiments, the first and second via holes 210 and 220 may be formed by forming a photoresist layer on the first insulating interlayer 190, patterning the photoresist layer by an exposure process and a developing process to form a photoresist pattern, and partially etching, e.g., performing the first dry etching process on, the first insulating interlayer 190, the substrate 130, the etch stop layer 120, and the conductive pad layer 110 through the photoresist pattern. The photoresist pattern may be removed by, e.g., an ashing process and/or a stripping process.

The first dry etching process may be performed by providing an etching gas including ion and/or plasma onto an upper surface of the first insulating interlayer 190 exposed by the photoresist pattern. In example embodiments, the first dry etching process may include a sputtering process or a plasma etching process.

In example embodiments, the first dry etching process may be performed by providing in the vertical direction an etching gas having a concentration of ion or plasma that may change in the horizontal direction, and thus a bottom of each of the first and second via holes 210 and 220 may not be flat, e.g., may be curved. That is, the bottom of each of the first and second via holes 210 and 220 may have a slope that may change in the horizontal direction with respect to the active surface 131 or the inactive surface 132 of the substrate 130, e.g., the bottom of each of the first and second via holes 210 and 220 may be convex with respect to the first and second via holes 210 and 220.

In an example embodiment, the first dry etching process may be performed by providing in the vertical direction an etching gas that may have a relatively high concentration of ion or plasma on a central portion of the exposed upper surface of the first insulating interlayer 190 and a relatively low concentration of ion or plasma on an edge portion of the exposed upper surface of the first insulating interlayer 190, and thus each of the first and second via holes 210 and 220 may have a convex bottom.

FIG. 3 shows one first via hole 210 and one second via hole 220. However, embodiments are not limited thereto, e.g., a plurality of first via holes 210 and a plurality of second via holes 220 may be formed.

The first dry etching process may be stopped by the etch stop layer 120 and the conductive pad layer 110. Thus, the first via holes 210 may have substantially the same depth, the second via holes 220 may have substantially the same depth, and further the first and second via holes 210 and 220 having the different widths may also have substantially the same depth. That is, the depth uniformity of the first via holes 210, the depth uniformity of the second via holes 220, and the depth uniformity of the first and second via holes 210 and 220 may be firstly controlled by the etch stop layer 120, and secondly by the conductive pad layer 110.

Figure 4:
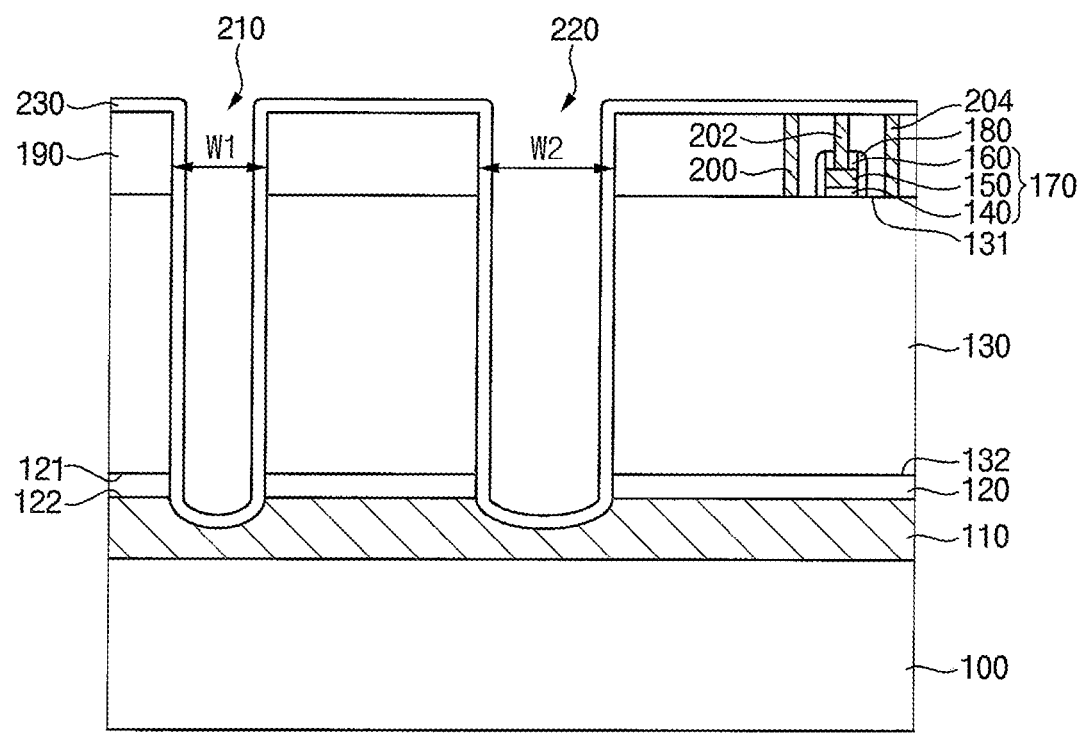

Referring to FIG. 4, an insulation layer 230 may be formed on inner walls of the first and second via holes 210 and 220 and an upper surface of the first insulating interlayer 190. In example embodiments, the insulation layer 230 may be, e.g., conformally, formed by, e.g., a physical vapor deposition (PVD) process, a chemical vapor deposition (CVD) process or an atomic layer deposition (ALD) process. For example, the insulation layer 230 may include an oxide, e.g., silicon oxide, a nitride e.g., silicon nitride, and/or carbonitride, e.g., silicon carbonitride.

Figure 5:
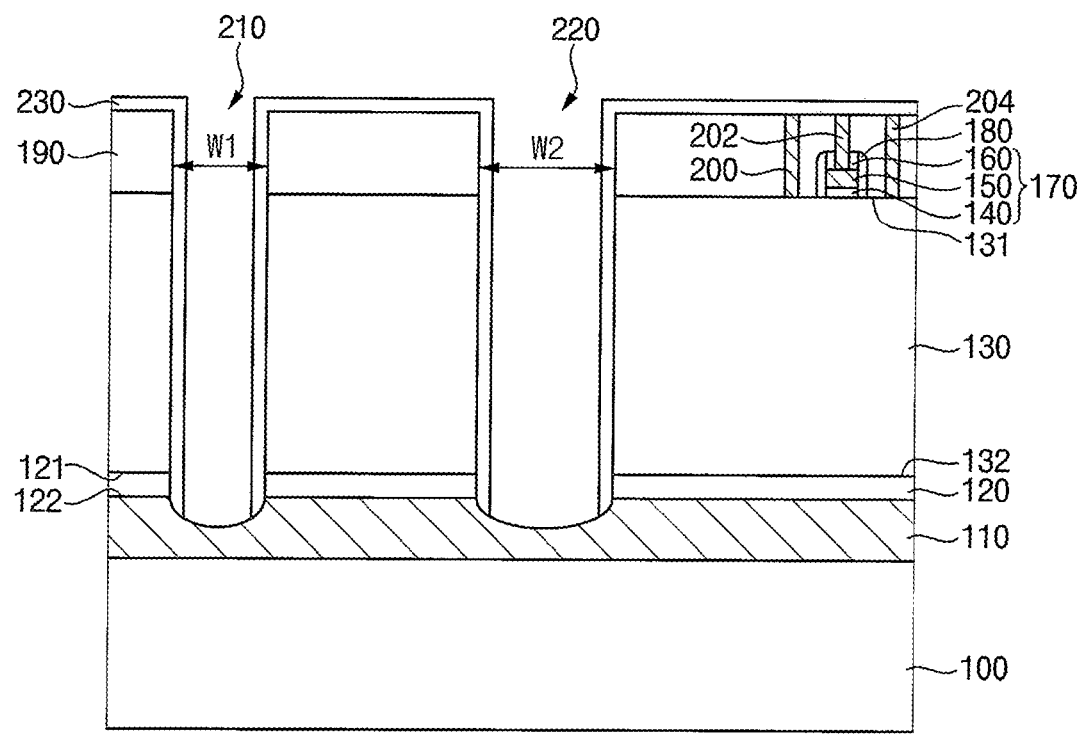

Referring to FIG. 5, a second dry etching process may be performed on the insulation layer 230 to expose the conductive pad layer 110. The second dry etching process may be performed by providing an etching gas including ion and/or plasma onto a portion of the insulation layer 230 on a central bottom of each of the first and second via holes 210 and 220. In example embodiments, the second dry etching process may include a sputtering process or a plasma etching process.

Figure 6:
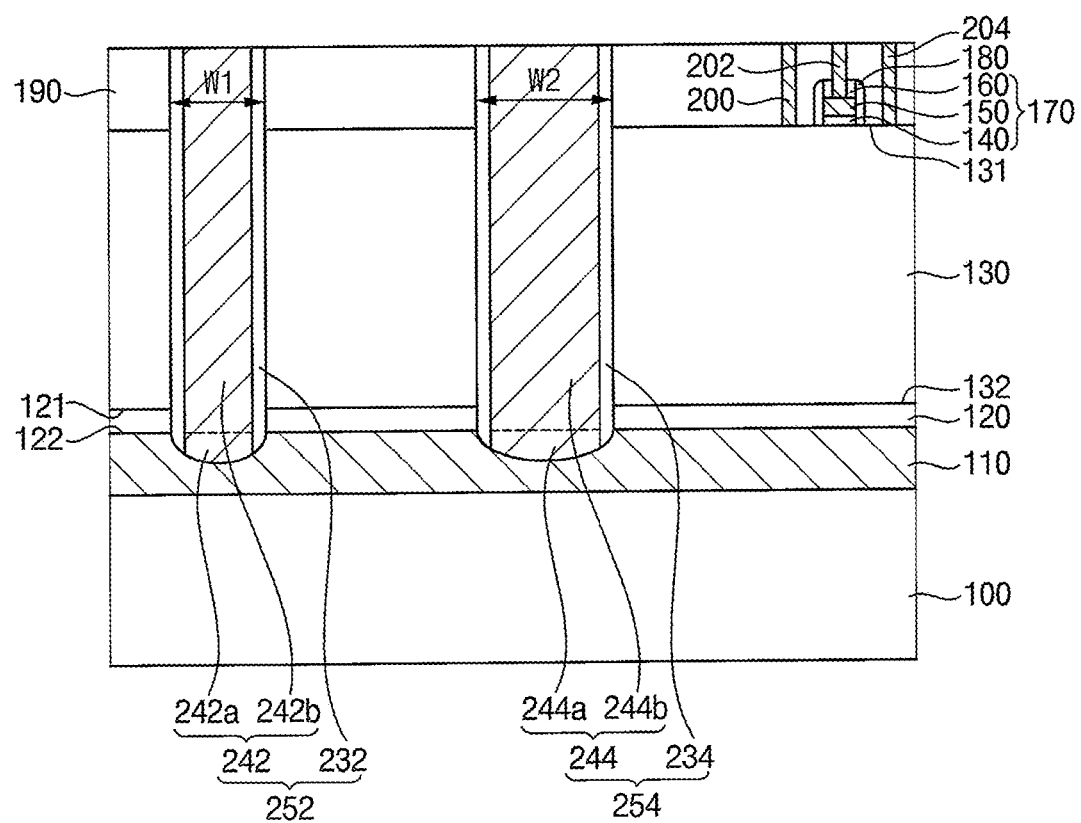

Referring to FIG. 6, a through-hole electrode layer may be formed on the insulation layer 230 and the exposed conductive pad layer 110 to, e.g., completely, fill the first and second via holes 210 and 220. The through-hole electrode layer and the insulation layer 230 may be planarized until the upper surface of the first insulating interlayer 190 is exposed so that first and second through-hole electrode structures 252 and 254 may be formed in the first and second via holes 210 and 220, respectively. In example embodiments, the through-hole electrode layer may be formed by, e.g., a PVD process, a CVD process or an ALD process.

The first through-hole electrode structure 252 may include a first through-hole electrode 242 and a first insulation pattern 232 covering a sidewall of the first through-hole electrode 242. The first through-hole electrode 242 may include a first protrusion portion 242a protruding from, e.g., beyond, the second surface 122 of the etch stop layer 120 downwardly and a first main portion 242b. For example, as illustrated in FIG. 6, the first main portion 242b may extend, e.g., continuously, from the first insulating interlayer 190 to the second surface 122 of the etch stop layer 120, and the first protrusion portion 242a may extend within the conductive pad layer 110, e.g., from the second surface 122 of the etch stop layer 120 to a predetermined depth in the conductive pad layer 110. The first through-hole electrode structure 252 may further include a first barrier pattern between the first through-hole electrode 242 and the first insulation pattern 232.

The second through-hole electrode structure 254 may include a second through-hole electrode 244 and a second insulation pattern 234 covering a sidewall of the second through-hole electrode 244. The second through-hole electrode 244 may include a second protrusion portion 244a protruding from, e.g., beyond, the second surface 122 of the etch stop layer 120 downwardly and a second main portion 244b, e.g., in a similar structure to the first through-hole electrode 242. The second through-hole electrode structure 254 may further include a second barrier pattern between the second through-hole electrode 244 and the second insulation pattern 234.

Lowermost surfaces of the first and second through-hole electrode structures 252 and 254 may not be flat, and may have a slope with respect to the active surface 131 or the inactive surface 132 of the substrate 130 that may vary in the horizontal direction. Thus, a lower surface of each of the first protrusion portion 242a of the first through-hole electrode structure 252 and the second protrusion portion 244a of the second through-hole electrode structure 254 may not be flat, e.g., may be curved along the curved surface of a bottom of a corresponding one of the first and second via holes 210 and 220, and may have a slope with respect to the active surface 131 or the inactive surface 132 of the substrate 130 that may vary in the horizontal direction. Additionally, lower surfaces of a portion of the first insulation pattern 232 covering a sidewall of the first protrusion portion 242a and a portion of the second insulation pattern 234 covering a sidewall of the second protrusion portion 244a may also have slopes with respect to the active surface 131 or the inactive surface 132 of the substrate 130 that may vary in the horizontal direction, e.g., lower surfaces of the first and second insulation patterns 232 and 234 may be in direct contact with and curved along the curved surfaces of the bottoms of the respective first and second via holes 210 and 220.

In an example embodiment, the lower surfaces of the first and second through-hole electrode structures 252 and 254 may be convex downwardly. Thus, the first protrusion portion 242a of the first through-hole electrode structure 252 and the second protrusion portion 244a of the second through-hole electrode structure 254 may be convex downwardly.

The first and second through-hole electrode structures 252 and 254 may have first and second widths W1 and W2, respectively. The first and second through-hole electrode structures 252 and 254 may include a metal, e.g., tungsten, copper, aluminum, etc., and the first and second barrier patterns may include a metal nitride, e.g., tungsten nitride, titanium nitride, tantalum nitride, etc.

Figure 7:
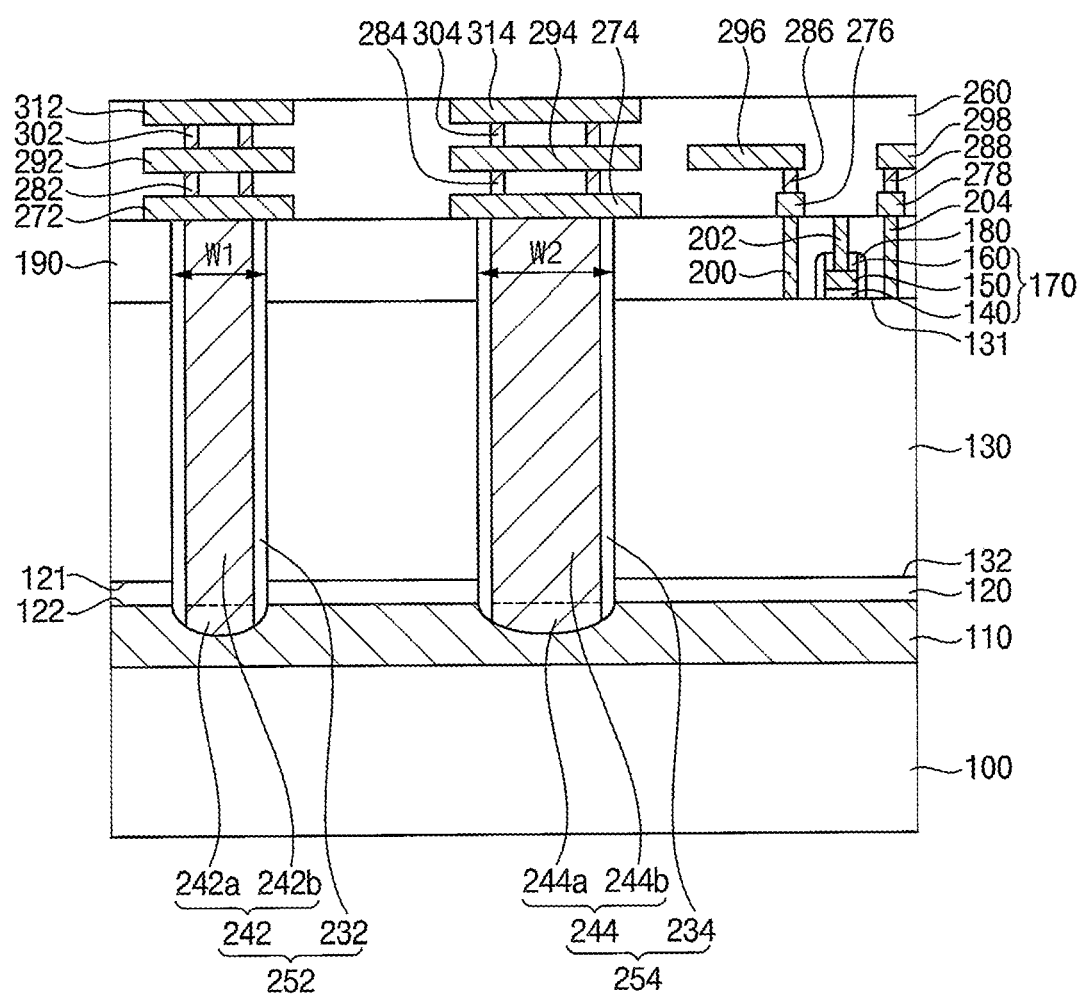

Referring to FIG. 7, a wiring layer 260 including first to eighth wirings 272, 274, 276, 278, 292, 294, 296 and 298, first to sixth vias 282, 284, 286, 288, 302 and 304, and first to second bonding pads 312 and 314 may be formed on the first insulating interlayer 190.

The wiring layer 260 may be formed by alternately and repeatedly stacking a buffer layer and a wiring insulation layer in the vertical direction. The buffer layer may include, e.g., silicon nitride, silicon carbonitride, silicon oxycarbonitride, and the wiring insulation layer may include, e.g., silicon oxide, silicon oxide doped with carbon, or silicon carbonitride.

The first to fourth wirings 272, 274, 276 and 278 may be formed on the first insulating interlayer 190, and may contact upper surfaces of the first and second through-hole electrode structures 252 and 254 and the first to third contact plugs 200 and 204.

The first via 282, the fifth wiring 292, the fifth via 302, and the first bonding pad 312 may be sequentially stacked on the first wiring 272. The second via 284, the sixth wiring 294, the sixth via 304, and the second boding pad 314 may be sequentially stacked on the second wiring 274. The third via 286 and the seventh wiring 296 may be sequentially stacked on the third wiring 276, and the fourth via 288 and the eighth wiring 298 may be sequentially stacked on the fourth wiring 278. The first to eighth wirings 272, 274, 276, 278, 292, 294, 296 and 298, the first to sixth vias 282, 284, 286, 288, 302 and 304, and the first to second bonding pads 312 and 314 may include a metal, e.g., tungsten.

Figure 8:
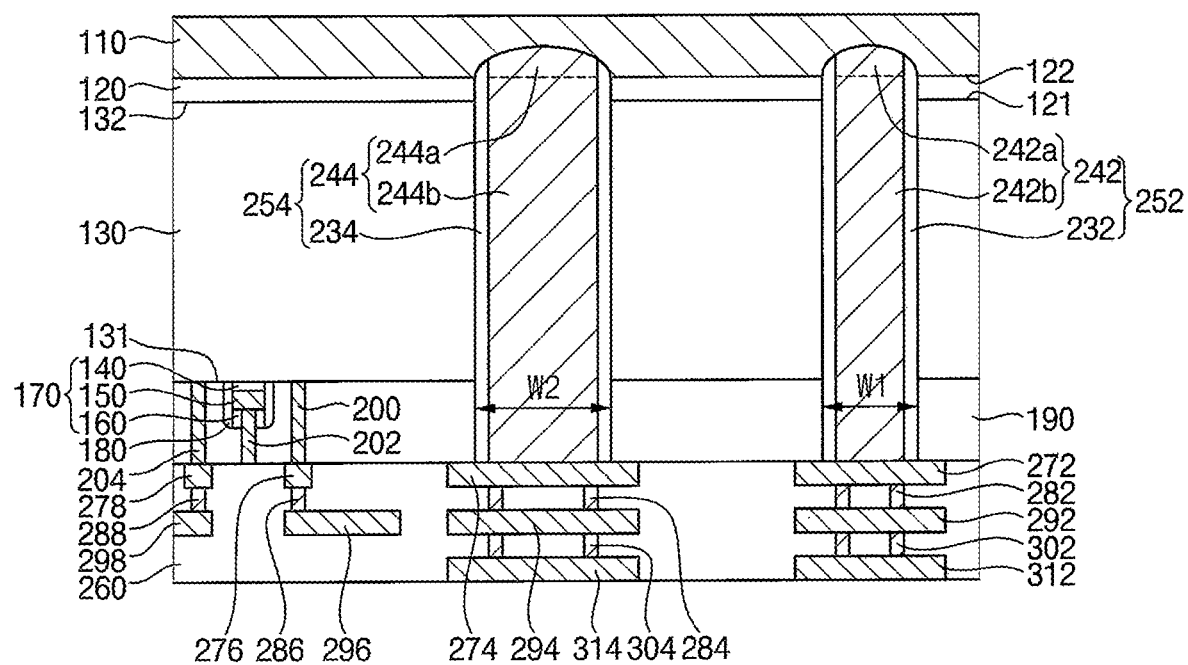

Referring to FIG. 8, the substrate 130 may be overturned using a carrier pattern so that the inactive surface 132 of the substrate 130 may face upward. Hereinafter, the lower surfaces of the first and second through-hole electrode structures 252 and 254 may be referred to as upper surfaces thereof. The sacrificial substrate 100 may be removed, e.g., by an etch back process and/or a grinding process, so a surface of the conductive pad layer 110 may be exposed.

Figure 9:
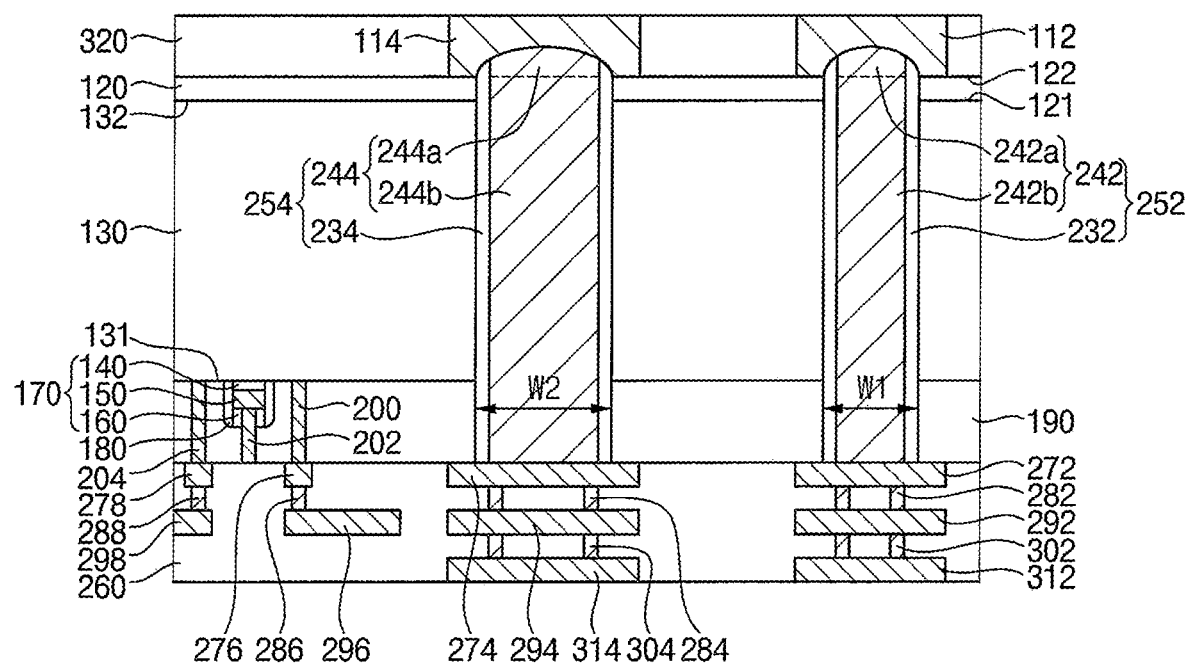

Referring to FIG. 9, the conductive pad layer 110 may be patterned to form first and second conductive pads 112 and 114 covering the first and second through-hole electrode structures 252 and 254, respectively. For example, referring to FIG. 9, portions of the conductive pad layer 110 may be removed to leave only the first and second conductive pads 112 and 114 on the first and second through-hole electrode structures 252 and 254, respectively.

The first and second conductive pads 112 and 114 may, e.g., directly, contact the first protrusion portion 242a of the first through-hole electrode structure 252 and the second protrusion portion 244a of the second through-hole electrode structure 254, respectively. Thus, portions of the first and second conductive pads 112 and 114 contacting the first and second protrusion portions 242a and 244a, respectively, may not be flat, and may have slopes with respect to the active surface 131 or the inactive surface 132 of the substrate 130 that may vary in the horizontal direction, e.g., the first and second conductive pads 112 and 114 may have complementary shapes with respect to the first and second through-hole electrode structures 252 and 254. In an example embodiment the portions of the first and second conductive pads 112 and 114 contacting the first and second protrusion portions 242a and 244a may be concave upwardly.

A second insulating interlayer 320 may be formed on the second surface 122 of the etch stop layer 120 and the first and second conductive pads 112 and 114, and may be planarized until upper surfaces of the first and second conductive pads 112 and 114 are exposed to complete the fabrication of the semiconductor device, e.g., the upper surfaces of the first and second conductive pads 112 and 114 may be coplanar with an upper surface of the second insulating interlayer 320. The second insulating interlayer 320 may include an oxide, e.g., silicon oxide.

As illustrated above, the etch stop layer 120 and the conductive pad layer 110 may be formed before forming the first and second via holes 210 and 220. Thus, during the first dry etching process, the depth variation between the first via holes 210, the depth variation between the second via holes 220, and the depth variation between the first and second via holes 210 and 220 may not be generated. As a result, the first and second through-hole electrode structures 252 and 254 may have substantially the same height by the etch stop layer 120 and the conductive pad layer 110, and thus the first and second conductive pads 112 and 114 covering the first and second through-hole electrode structures 252 and 254 may have substantially the same height.

Additionally, the conductive pad layer 110 may be partially etched by the first dry etching process, and the conductive pad layer 110 may be patterned to form the first and second conductive pads 112 and 114 covering the first and second through-hole electrode structures 252 and 254, respectively. Thus, the first and second conductive pads 112 and 114 may include lower surfaces having shapes corresponding, e.g., complementary, with respect to the upper surfaces of the first and second through-hole electrode structures 252 and 254.

The semiconductor device may include the etch stop layer 120, the first and second through-hole electrode structures 252 and 254, and the first and second conductive pads 112 and 114. The semiconductor device may further include the circuit pattern, the wiring layer 260, and the first and second insulating interlayers 190 and 320.

Each of the first and second through-hole electrode structures 252 and 254 may include a sidewall having a constant slope with respect to the horizontal direction and an upper surface having a slope with respect to the active surface 131 or the inactive surface 132 of the substrate 130 varying in the horizontal direction. Thus, each of the first and second through-hole electrodes 242 and 244 may have a constant slope with respect to the horizontal direction and an upper surface having a slope with respect to the active surface 131 or the inactive surface 132 of the substrate 130 varying in the horizontal direction. The upper surfaces of the first and second through-hole electrodes 242 and 244 may be higher than the second surface 122 of the etch stop layer 120. In an example embodiment, the upper surfaces of the first and second through-hole electrodes 242 and 244 may be convex upwardly.

Upper portions of the first and second insulation patterns 232 and 234 may cover upper sidewalls of the first and second through-hole electrodes 242 and 244, respectively, and may have slopes with respect to the active surface 131 or the inactive surface 132 of the substrate 130 that may vary in the horizontal direction.

The first and second conductive pads 112 and 114 may contact the upper surfaces of the first and second through-hole electrodes 242 and 244, respectively. Thus, lower surfaces of portions of the first and second conductive pads 112 and 114 contacting the upper surfaces of the first and second through-hole electrodes 242 and 244 may not be flat, and may have slopes with respect to the active surface 131 or the inactive surface 132 of the substrate 130 that may vary in the horizontal direction. In an example embodiment, the lower surfaces of the portions of the first and second conductive pads 112 and 114 contacting the upper surfaces of the first and second through-hole electrodes 242 and 244 may be concave upwardly.

Figure 10:
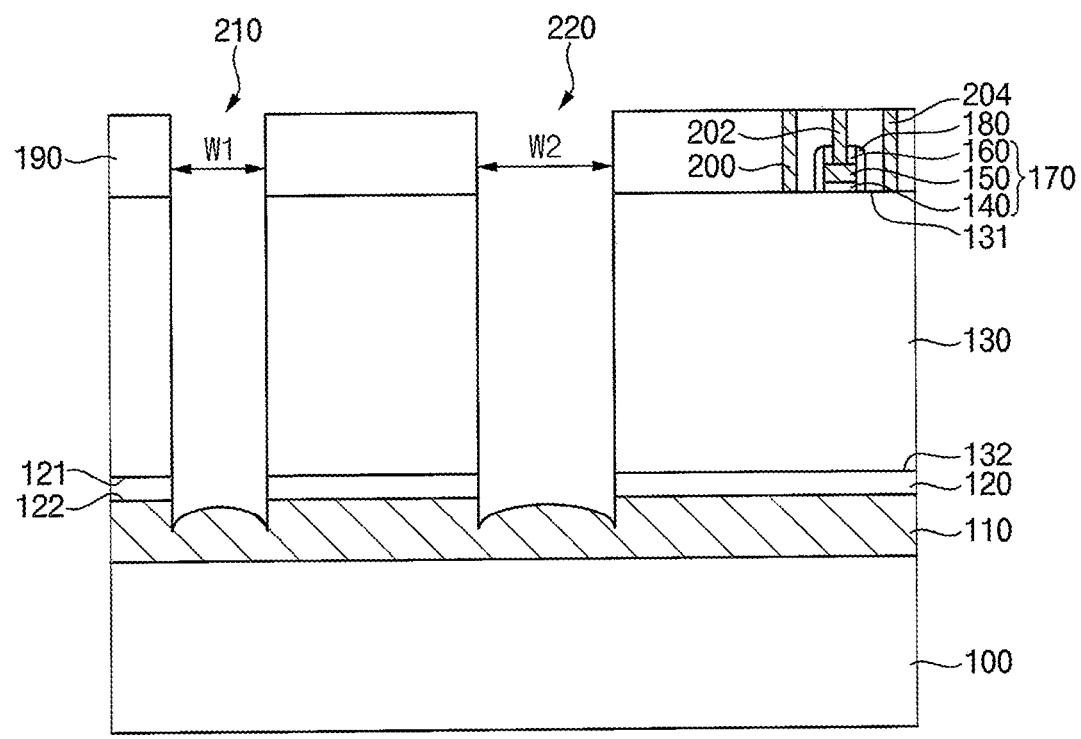
FIGS. 10 and 11 are cross-sectional views illustrating stages in a method of manufacturing a semiconductor device in accordance with example embodiments.
Figure 11:
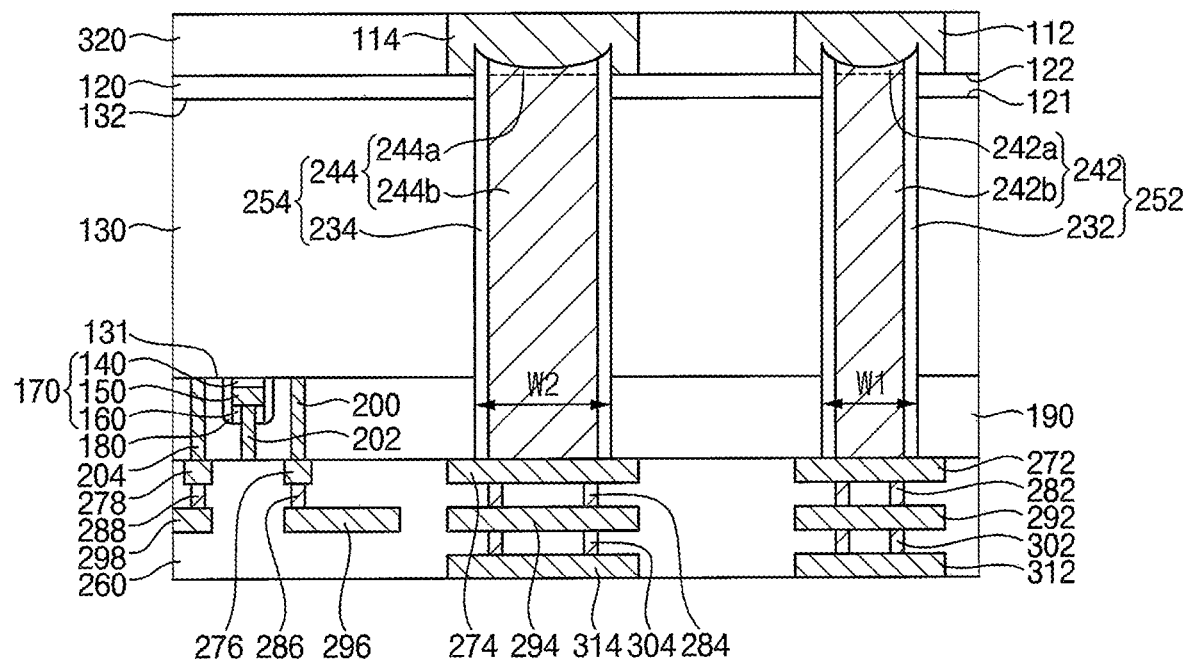

FIGS. 10 and 11 are cross-sectional views illustrating stages in a method of manufacturing a semiconductor device in accordance with example embodiments. This method may include processes substantially the same as or similar to those illustrated with reference to FIGS. 1 to 9, and thus repeated explanations thereon are omitted herein.

Referring to FIG. 10, processes substantially the same as or similar to those illustrated with reference to FIGS. 1 to 3 may be performed so that the first and second via holes 210 and 220 may be formed through the first insulating interlayer 190, the substrate 130, the etch stop layer 120, and a portion of the conductive pad layer 110 by the first dry etching process.

In an example embodiment, the first dry etching process may be performed by providing an etching gas including ion and/or plasma onto an upper surface of the first insulating interlayer 190 exposed by the photoresist pattern. In example embodiments, the first dry etching process may include a sputtering process or a plasma etching process.

In example embodiments, the first dry etching process may be performed by providing in the vertical direction an etching gas that may have a relatively high concentration of ion or plasma on an edge portion of the exposed upper surface of the first insulating interlayer 190 and a relatively low concentration of ion or plasma on a central portion of the exposed upper surface of the first insulating interlayer 190, and thus each of the first and second via holes 210 and 220 may have a concave bottom.

Referring to FIG. 11, processes substantially the same as or similar to those illustrated with reference to FIGS. 4 to 9 may be performed to complete the fabrication of the semiconductor device.

In an example embodiment, the upper surfaces of the first and second through-hole electrode structures 252 and 254 may be concave upwardly. Thus, the first and second protrusion portions 242a and 244a of the first and second through-hole electrode structures 252 and 254, respectively, may be concave, and the upper surfaces of the first and second through-hole electrodes 242 and 244 may be concave.

In an example embodiment, the portions of the first and second conductive pads 112 and 114 contacting the first and second protrusion portions 242a and 244a, i.e., the upper surfaces of the first and second through-hole electrodes 242 and 244, may be convex downwardly.

Figure 12:
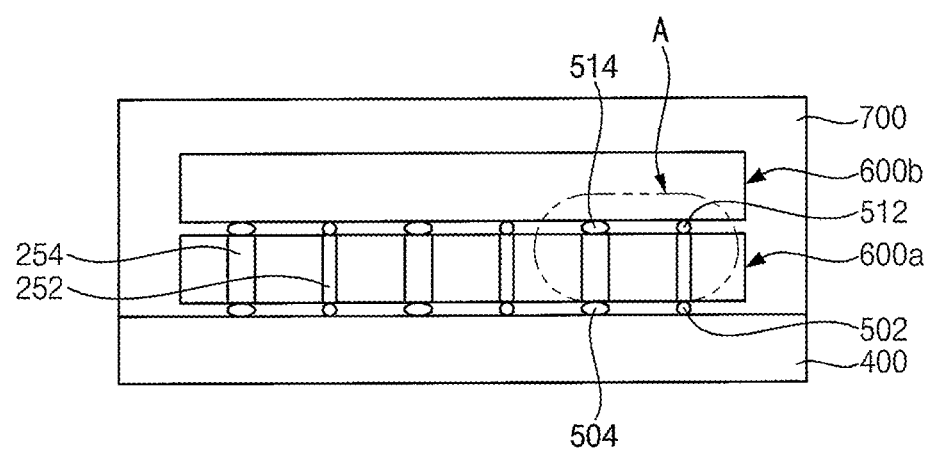
FIGS. 12 and 13 are cross-sectional views illustrating a semiconductor package in accordance with example embodiments.
Figure 13:
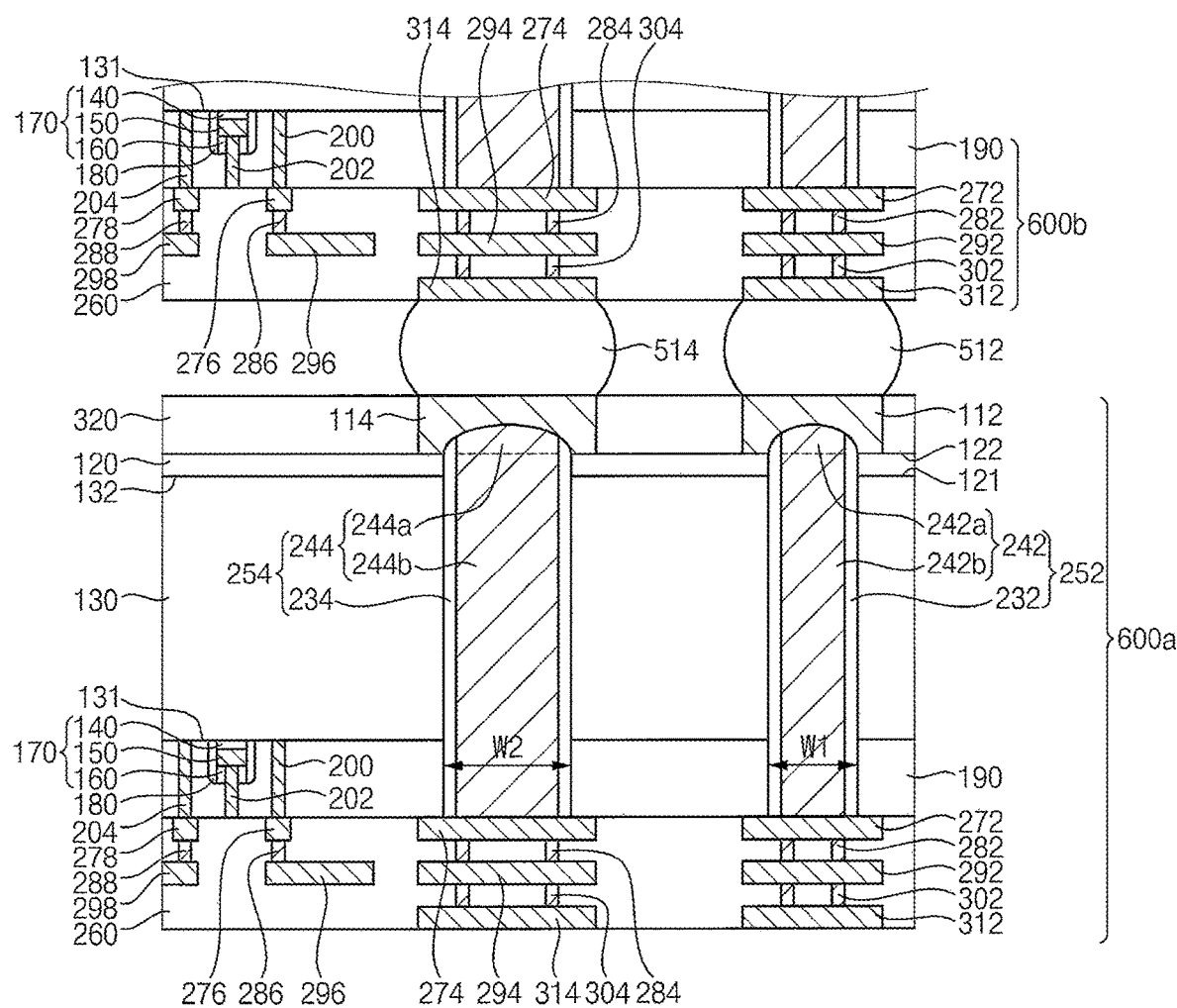

FIGS. 12 and 13 are cross-sectional views illustrating a semiconductor package in accordance with example embodiments. Particularly, FIG. 13 is an enlarged cross-sectional view of region A of FIG. 12. This semiconductor package may include a semiconductor device manufactured according to the method of FIGS. 1 to 9. Thus, like reference numerals refer to like elements, and repeated explanations thereon are omitted herein.

Referring to FIGS. 12 and 13, a semiconductor package may include a package substrate 400, first and second semiconductor chips 600*a* and 600*b* stacked on the package substrate 400, and a molding element 700. The semiconductor package may further include first to fourth conductive bumps 502, 504, 512 and 514, and outer connection terminals.

The package substrate 400 may be a printed circuit board (PCB) including circuit patterns therein. The package substrate 400 may include substrate pads on an upper surface thereof, and the outer connection terminals, e.g., solder balls, on a lower surface thereof.

FIG. 13 shows two semiconductor chips, i.e., the first and second semiconductor chips 600*a* and 600*b*, stacked on top of each other. However, embodiments are not limited thereto, e.g., four (4), eight (8), twelve (12), sixteen (16), or more semiconductor chips may be stacked. Each of the first and second semiconductor chips 600*a* and 600*b* may include integrated circuit chips, e.g., memory chips or logic chips.

The first and second conductive bumps 502 and 504 may be interposed between the package substrate 400 and the first semiconductor chip 600*a*. The first conductive bump 502 may electrically connect the substrate pad of the package substrate 400 and a first bonding pad (e.g., the first bonding pad 312 on the bottom of FIG. 13) of the first semiconductor chip 600*a*, and the second conductive bump 504 may electrically connect the substrate pad of the package substrate 400 and a second bonding pad (e.g., the second bonding pad 314 on the bottom of FIG. 13) of the first semiconductor chip 600*a*.

The third and fourth conductive bumps 512 and 514 may be interposed between the first semiconductor chip 600*a* and the second semiconductor chip 600*b*. The third conductive bump 512 may electrically connect the first conductive pad 112 of the first semiconductor chip 600*a* and the first bonding pad 312 of the second semiconductor chip 600*b*, and the fourth conductive bump 514 may electrically connect the second conductive pad 114 of the first semiconductor chip 600*a* and the second bonding pad 314 of the second semiconductor chip 600*b*.

Alternatively, the third and fourth conductive bumps 512 and 514 may not be formed. In this case, the first conductive pad 112 of the first semiconductor chip 600*a* and the first bonding pad 312 of the second semiconductor chip 600*b* may be directly bonded with each other, and the second conductive pad 114 of the first semiconductor chip 600*a* and the second bonding pad 314 of the second semiconductor chip 600*b* may be directly bonded with each other (e.g., Cu—Cu hybrid bonding).

The molding element 700 may cover the first and second semiconductor chips 600*a* and 600*b* on the package substrate 400. The molding element 700 may include, e.g., epoxy molding compound (EMC).

Hereinafter, a method of manufacturing the semiconductor package of FIGS. 12 and 13 is explained.

The third and fourth conductive bumps 512 and 514 may be formed on the first and second bonding pads 312 and 314, respectively, of the second semiconductor chip 600*b*, and the second semiconductor chip 600*b* may be stacked on the first semiconductor chip 600*a* through the first and second conductive bumps 512 and 514. In example embodiments, the first and second conductive bumps 512 and 514 may be placed on the first and second bonding pads 312 and 314, respectively, of the second semiconductor chip 600*b*, and the second semiconductor chip 600*b* may be bonded with the first semiconductor chip 600*a* by, e.g., a reflow process. The first and second semiconductor chips 600*a* and 600*b* may be mounted onto the package substrate 400 using the first and second conductive bumps 502 and 504, so that the semiconductor package may be manufactured.

As illustrated above, the first and second through-hole electrode structures 252 and 254 may have substantially the same height by the etch stop layer 120 and the conductive pad layer 110, and the first and second conductive pads 112 and 114 covering the first and second through-hole electrode structures 252 and 254 may also have substantially the same height. That is, the first and second through-hole electrode structures 252 and 254 may have height uniformity and the first and second conductive pads 112 and 114 may have height uniformity. Thus, the first and second semiconductor chips 600*a* and 600*b* may be easily stacked in the vertical direction.

The semiconductor package may include a semiconductor device, e.g., a logic device or a memory device. Particularly, the semiconductor package may include a logic device, e.g., central processing unit (CPU), micro processing unit (MPU), application processor (AP), etc., a volatile memory device, e.g., a static random-access memory (SRAM) device, a dynamic random-access memory (DRAM) device, etc., or a non-volatile device, e.g., a flash memory device, a phase-change random-access memory (PRAM) device, a magnetoresistive random-access memory (MRAM) device, a resistive random-access memory (RRAM) device, etc.

Figure 14:
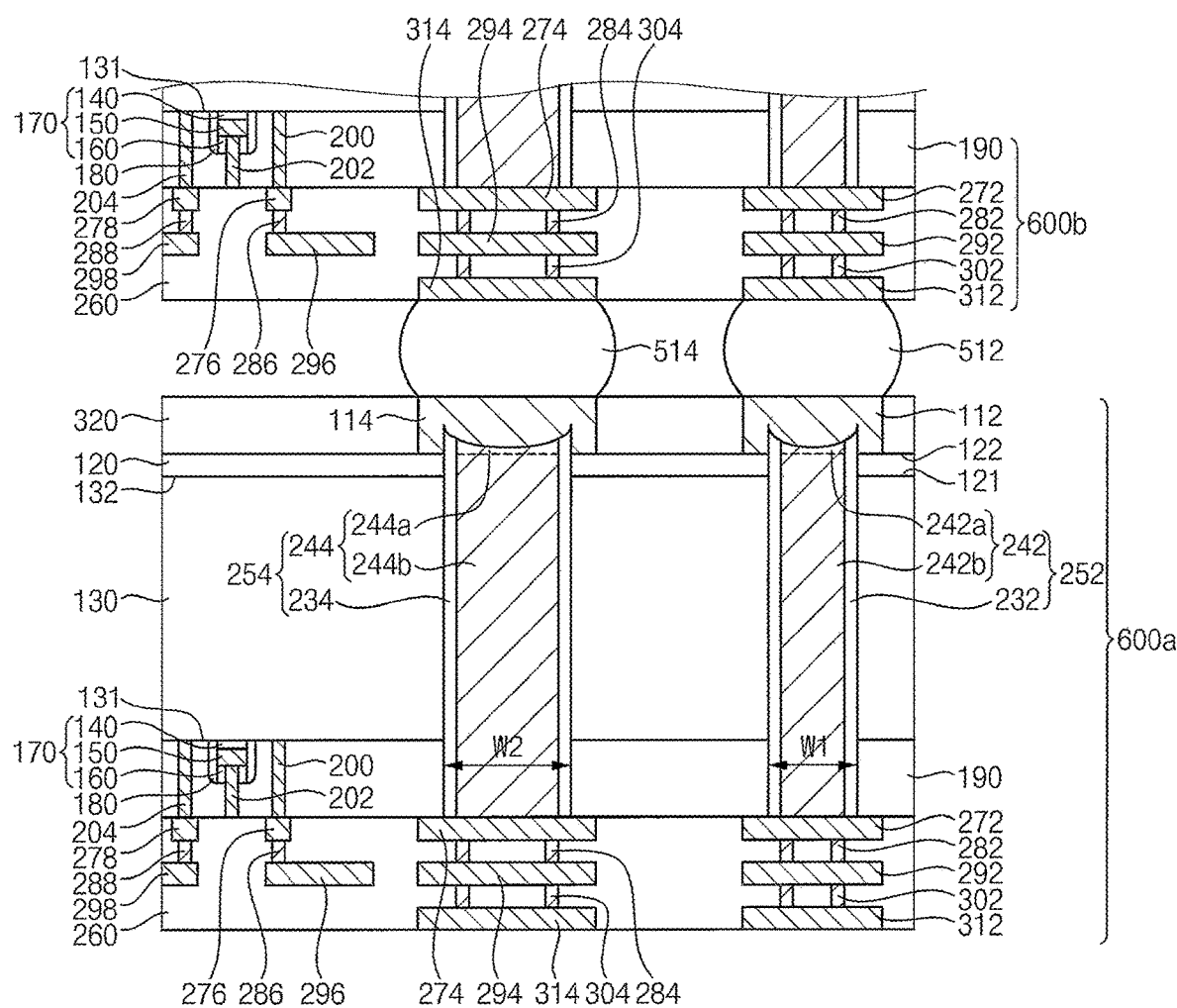
FIG. 14 is a cross-sectional view illustrating a semiconductor package in accordance with example embodiments.

FIG. 14 is a cross-sectional view illustrating a semiconductor package in accordance with example embodiments. Particularly, FIG. 14 is an enlarged cross-sectional view of the region A of FIG. 12. This semiconductor package may include the semiconductor device illustrated with respect to FIGS. 10 and 11. Thus, like reference numerals refer to like elements, and repeated explanations thereon are omitted herein. Referring to FIG. 14, the first and second semiconductor chips 600*a* and 600*b* including the semiconductor device of FIG. 11 may be stacked in the vertical direction.

By way of summation and review, example embodiments provide a semiconductor device having improved characteristics. That is, an etch stop layer and a conductive pad layer may be formed, and thus, during a dry etching process for forming first and second via holes having different widths, the first via holes and the second via holes may have uniform depths. As a result, first and second through-hole electrode structures that may be formed in the first and second via holes, respectively, may have substantially the same height. Accordingly, first and second conductive pads covering the first and second through-hole electrode structures, respectively, may also have substantially the same height. The semiconductor devices including the first and second through-hole electrode structures and the first and second conductive pads may be easily stacked.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
an etch stop layer on the substrate, the etch stop layer including a first surface adjacent to the substrate and a second surface opposite the first surface;
a through-hole electrode extending through the substrate and the etch stop layer in a vertical direction substantially perpendicular to an upper surface of the substrate, the through-hole electrode including a protrusion portion that protrudes beyond the second surface of the etch stop layer, and the protrusion portion being not flat; and
a conductive pad covering the protrusion portion of the through-hole electrode,
wherein:
the through-hole electrode is a first through-hole electrode,
the protrusion portion of the first through-hole electrode is a first protrusion portion,
the semiconductor device further includes a second through-hole electrode extending through the substrate and the etch stop layer in the vertical direction, the second through-hole electrode having a width different from that of the first through-hole electrode and including a second protrusion portion that protrudes beyond the second surface of the etch stop layer, and
the second protrusion portion of the second through-hole electrode is not flat.

2. The semiconductor device as claimed in claim 1, wherein the protrusion portion of the through-hole electrode is convex.

3. The semiconductor device as claimed in claim 1, wherein the protrusion portion of the through-hole electrode is concave.

4. The semiconductor device as claimed in claim 1, further comprising an insulation pattern covering a sidewall of the through-hole electrode, the through-hole electrode and the insulation pattern constituting a through-hole electrode structure.

5. The semiconductor device as claimed in claim 4, wherein the insulation pattern covers a sidewall of the protrusion portion of the through-hole electrode.

6. The semiconductor device as claimed in claim 5, wherein a portion of the insulation pattern covering the sidewall of the protrusion portion of the through-hole electrode has a slope with respect to the upper surface of the substrate that varies in a horizontal direction substantially parallel to the upper surface of the substrate.

7. The semiconductor device as claimed in claim 1, wherein the conductive pad contacts the protrusion portion of the through-hole electrode, a portion of the conductive pad contacting the protrusion portion being not flat.

8. The semiconductor device as claimed in claim 1, wherein the first protrusion portion and the second protrusion portion have a substantially same height.

9. The semiconductor device as claimed in claim 1, wherein the first through-hole electrode and the second through-hole electrode have a substantially same height.

10. A semiconductor device, comprising:
a substrate;
an etch stop layer on the substrate;
a through-hole electrode extending through the substrate and the etch stop layer in a vertical direction substantially perpendicular to an upper surface of the substrate, the through-hole electrode including:
an upper electrode surface having a slope with respect to the upper surface of the substrate that varies in a horizontal direction substantially parallel to the upper surface of the substrate, the etch stop layer being between the substrate and the upper electrode surface; and
a conductive pad covering the upper electrode surface of the through-hole electrode,
wherein:
the through-hole electrode is a first through-hole electrode, and
the semiconductor device further includes a second through-hole electrode extending through the substrate and the etch stop layer in the vertical direction, the second through-hole electrode having a width different from a width of the first through-hole electrode and including an electrode top surface having a slope with respect to the upper surface of the substrate that varies in the horizontal direction.

11. The semiconductor device as claimed in claim 10, wherein the etch stop layer includes a first surface adjacent to the substrate and a second surface opposite the first surface, the upper electrode surface of the through-hole electrode being higher than the second surface of the etch stop layer.

12. The semiconductor device as claimed in claim 10, wherein the upper electrode surface defines a protrusion portion above the etch stop layer, the protrusion portion being convex.

13. The semiconductor device as claimed in claim 10, wherein the upper electrode surface defines a protrusion portion above the etch stop layer, the protrusion portion being concave.

14. The semiconductor device as claimed in claim 10, further comprising an insulation pattern covering the sidewall of the through-hole electrode, the through-hole electrode and the insulation pattern constituting a through-hole electrode structure.

15. The semiconductor device as claimed in claim 14, wherein:
the upper electrode surface defines a protrusion portion above the etch stop layer, and
the insulation pattern covers a sidewall of the protrusion portion of the through-hole electrode.

16. The semiconductor device as claimed in claim 14, wherein:
the upper electrode surface defines a protrusion portion above the etch stop layer, and
a portion of the insulation pattern covering a sidewall of the protrusion portion has a slope with respect to the upper surface of the substrate that varies in the horizontal direction.

17. The semiconductor device as claimed in claim 10, wherein the conductive pad contacts the upper electrode surface of the through-hole electrode, a portion of the conductive pad contacting the upper electrode surface of the through-hole electrode being not flat.

18. The semiconductor device as claimed in claim 10, wherein:
the first through-hole electrode further includes a sidewall having a slope with respect to the upper surface of the substrate that is constant in the horizontal direction, and the second through-hole electrode further includes an electrode sidewall having a slope with respect to the upper surface of the substrate that is constant in the horizontal direction.

19. A semiconductor device comprising:

a substrate;

an etch stop layer on the substrate, the etch stop layer including a first surface adjacent to the substrate and a second surface opposite the first surface;

a first through-hole electrode structure extending through the substrate and the etch stop layer in a vertical direction substantially perpendicular to an upper surface of the substrate, the first through-hole electrode structure including:

a first through-hole electrode including a first protrusion portion that protrudes beyond the second surface of the etch stop layer, and a first insulation pattern covering a sidewall of the first through-hole electrode;

a second through-hole electrode structure extending through the substrate and the etch stop layer in the vertical direction and having a width different from that of the first through-hole electrode structure, the second through-hole electrode structure including:

a second through-hole electrode including a second protrusion portion that protrudes beyond the second surface of the etch stop layer, and a second insulation pattern covering a sidewall of the second through-hole electrode; and first and second conductive pads covering the first protrusion portion and the second protrusion portion, respectively, each of the first protrusion portion and the second protrusion portion being not flat.

20. The semiconductor device as claimed in claim 19, wherein the first protrusion portion and the second protrusion portion have a substantially same height.

* * * * *